(12) United States Patent
Lee et al.

(10) Patent No.: US 6,683,788 B2
(45) Date of Patent: Jan. 27, 2004

(54) OPERATING DEVICE FOR HEAT SINK

(75) Inventors: Tsung-Lung Lee, Tu-chen (TW); Cheng-Tien Lai, Tu-chen (TW); Shuai Jiang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/175,944

(22) Filed: Jun. 19, 2002

(65) Prior Publication Data

US 2003/0151899 A1 Aug. 14, 2003

(30) Foreign Application Priority Data

Feb. 8, 2002 (TW) .................................. 91201718 U

(51) Int. Cl.[7] .................................................. H05K 7/20
(52) U.S. Cl. ................. 361/704; 361/719; 257/719; 257/718; 257/727; 174/16.3; 165/80.3
(58) Field of Search ................. 361/702–704, 361/707, 709, 719–722; 257/706, 707, 718, 719, 722; 174/16.3; 165/80.3, 185

(56) References Cited

U.S. PATENT DOCUMENTS

| | | | | |
|---|---|---|---|---|
| 5,493,475 A | * | 2/1996 | Lin | 361/710 |
| 5,808,236 A | * | 9/1998 | Brezina et al. | 174/16.3 |
| 6,160,709 A | * | 12/2000 | Li | 361/704 |
| 6,280,222 B1 | * | 8/2001 | Walkup | 439/331 |
| 6,404,633 B1 | * | 6/2002 | Hsu | 361/703 |
| 6,466,443 B1 | * | 10/2002 | Chen | 361/695 |
| 6,477,049 B1 | * | 11/2002 | Lin | 361/704 |

FOREIGN PATENT DOCUMENTS

TW        088210333        3/2001

\* cited by examiner

*Primary Examiner*—Boris Chervinsky
(74) *Attorney, Agent, or Firm*—Wei Te Chung

(57) ABSTRACT

An operating device (10) for detaching a heat sink (40) from a heat-generating electronic device (30) includes a bracket (12) and four handles (14) rotatably connected to the bracket. The bracket includes a pair of first beams (16) and a pair of second beams (18). The second beams perpendicularly connect with the first beams. An opening (21) is thereby defined in a central section of the bracket. A pair of symmetrically opposite pivots (20) extends from each end of each first beam. The handles each include an operating portion (22), and a pressing portion (24) perpendicular to the operating portion. A pair of pivot holes (26) is defined in two junctions of the operating portion and the pressing portion, pivotably receiving corresponding pivots of the bracket.

21 Claims, 3 Drawing Sheets

OPERATING DEVICE FOR HEAT SINK

BACKGROUND OF THE INVENTION

1. Field of the Invention

The present invention relates to operating devices for heat sinks, and more particularly to an operating device for a heat sink which facilitates detachment of the heat sink from a heat-generating electronic device such as a central processing unit (CPU).

2. Description of Related Art

A computer central processing unit (CPU) is the core administrator of electrical signals in many contemporary computers. Continued development of CPUs has enabled them to perform more and more functions. Correspondingly, heat generated by CPUs is constantly increasing. This can adversely affect the operational stability of computers. To speedily remove the heat from the CPU, a heat dissipation device having great heat conductivity is mounted on the CPU. The heat dissipation device is commonly a heat sink.

A conventional heat dissipation device is shown in Taiwan Patent Application No. 88210333. A clip is used to firmly attach the heat dissipation device to the CPU. In addition, thermal grease is often provided to fill a clearance between the heat sink and the CPU, and thereby achieve greater efficiency of heat dissipation.

Unfortunately, the thermal grease is prone to adhere between the heat sink and the CPU. When this happens, the heat sink is detachable from the CPU only with some difficulty. During detachment, the heat sink is liable to damage the CPU or a motherboard on which the CPU is mounted.

Thus, an operating device which can overcome the above-mentioned problems is strongly desired.

SUMMARY OF THE INVENTION

Accordingly, an object of the present invention is to provide an operating device which facilitates detachment of a heat sink from a heat-generating electronic device such as a CPU.

Another object of the present invention is to provide an operating device which protects a heat-generating electronic devices from being damaged during detachment of a heat sink from the electronic device.

In order to achieve the objects set out above, an operating device of the present invention for detaching a heat sink from a heat-generating electronic device includes a bracket and four handles rotatably connected to the bracket. The bracket comprises a pair of first beams and a pair of second beams. The second beams perpendicularly connect with the first beams. An opening is thereby defined in a central section of the bracket. A pair of symmetrically opposite pivots extends from each end of each first beam. The handles each comprise an operating portion, and a pressing portion perpendicular to the operating portion. A pair of pivot holes is defined in two junctions of the operating portion and the pressing portion, pivotably receiving corresponding pivots of the bracket.

Other objects, advantages and novel features of the present invention will become more apparent from the following detailed description when taken in conjunction with the accompanying drawings.

DETAILED DESCRIPTION OF THE INVENTION

Figure 1:
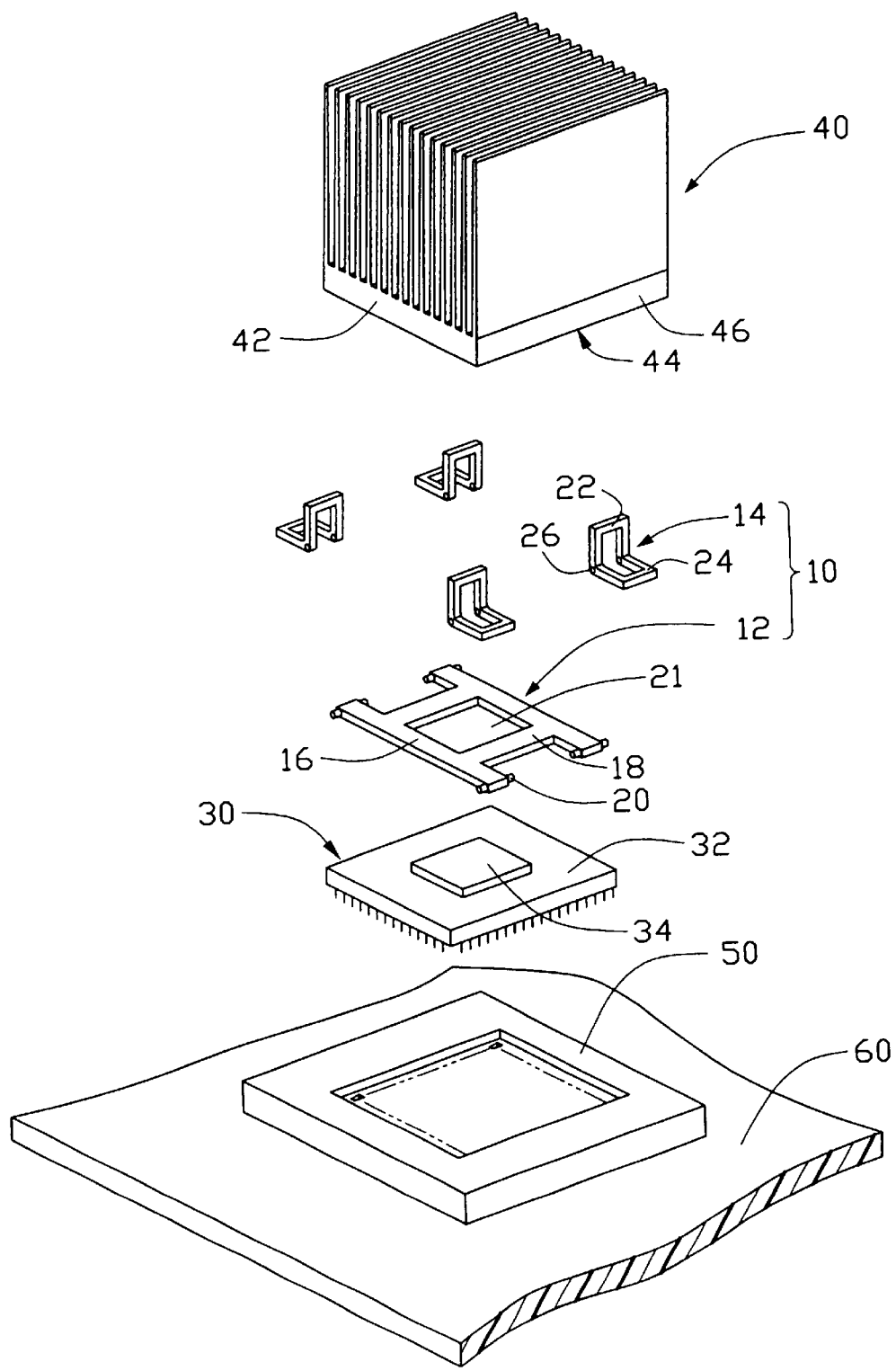
FIG. 1 is an exploded perspective view of an operating device in accordance with the present invention, a heat sink, a central processing unit (CPU), and a socket that is mounted to a printed circuit board.

Reference will now be made to the drawing figures to describe the present invention in detail.

FIG. 1 shows an operating device 10 in accordance with a preferred embodiment of the present invention, together with a heat-generating electronic device 30, a heat sink 40, a socket 50 and a printed circuit board (PCB) 60. For the purposes of conveniently describing the preferred embodiment, the heat-generating electronic device 30 is hereinafter assumed to be a central processing unit (CPU) 30. The CPU 30 is mountable on the socket 50, and the socket 50 is mounted on the PCB 60.

The CPU 30 comprises a base 32 incorporating densely packed electronic circuitry, and a protrusion 34 mounted on a central section of the base 32. The protrusion 34 may, for example, be a metal plate. When the circuitry is active, large amounts of heat may be generated and accumulated on the base 32. The protrusion 34 improves heat transfer from the base 32, and thus protects the circuitry. The heat sink 40 is attachable to the CPU 30 with a conventional fixing device (not shown). The heat sink 40 comprises a chassis 42, and a plurality of fins (not labeled) extending upwardly from a top surface of the chassis 42. The chassis 42 comprises a bottom surface 44 adapted for thermal contact with the protrusion 34, and a pair of opposite side surfaces 46.

The operating device 10 comprises a bracket 12 and four handles 14. The bracket 12 comprises a pair of parallel and spaced first beams 16, and a pair of parallel and spaced second beams 18 perpendicularly connecting with the first beams 16. A rectangular opening 21 is thus defined in a central section of the bracket 12 by the first and second beams 16, 18. A pair of symmetrically opposite pivots 20 respectively extends perpendicularly from opposite edges of an end portion of each first beam 16. Each handle 14 is generally a frame having an L-shaped profile. The handle 14 comprises an operating portion 22, and a pressing portion 24 perpendicular to the operating portion 22. A pair of pivot holes 26 is respectively defined in two junctions of the operating portion 22 and the pressing portion 24, for pivotably receiving corresponding pivots 20 of the bracket 12. The handle 14 is thereby connected to the bracket 12.

Figure 2:
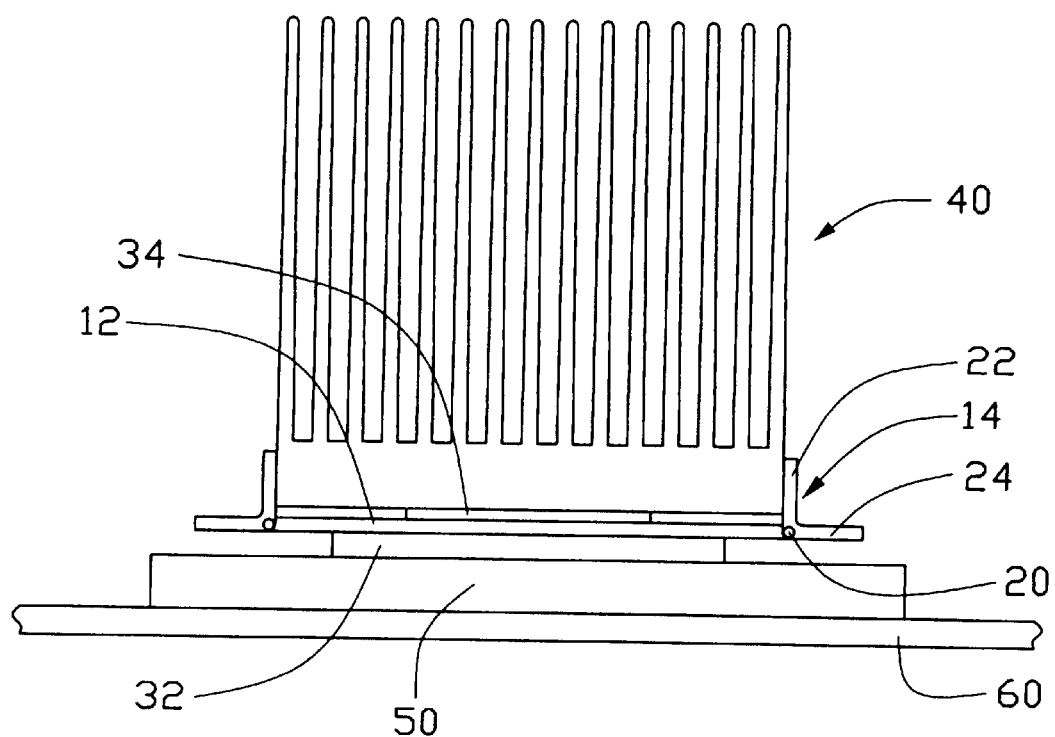
FIG. 2 is an assembled side view of FIG. 1.

FIG. 2 is a side view of the operating device 10 assembled with the CPU 30, the heat sink 40, the socket 50 and the PCB 60. The CPU 30 is mounted on the socket 50 that is mounted on the PCB 60. The operating device 20 is placed on a top of the base 32 of the CPU 30. The protrusion 34 of the CPU 30 is received in the opening 21 of the bracket 12. The heat sink 40 is attached on the protrusion 34 of the CPU 30 by a conventional fixing device (not shown). The chassis 42 of the heat sink 40 is parallel to the base 32 of the CPU 30, and parallel to the socket 50. The bracket 12 is located between the bottom surface 44 of the heat sink 40 and a top of the base 32 of the CPU 30. The handles 14 are respectively disposed at opposite sides of the heat sink 40. The operating portions 22 of the handles 14 respectively abut against the side surfaces 46 of the chassis 42 of the heat sink 40. The pressing portions 24 of the handles 14 are parallel to and a short distance from the socket 50, for facilitating operation of the handles 14.

Figure 3:
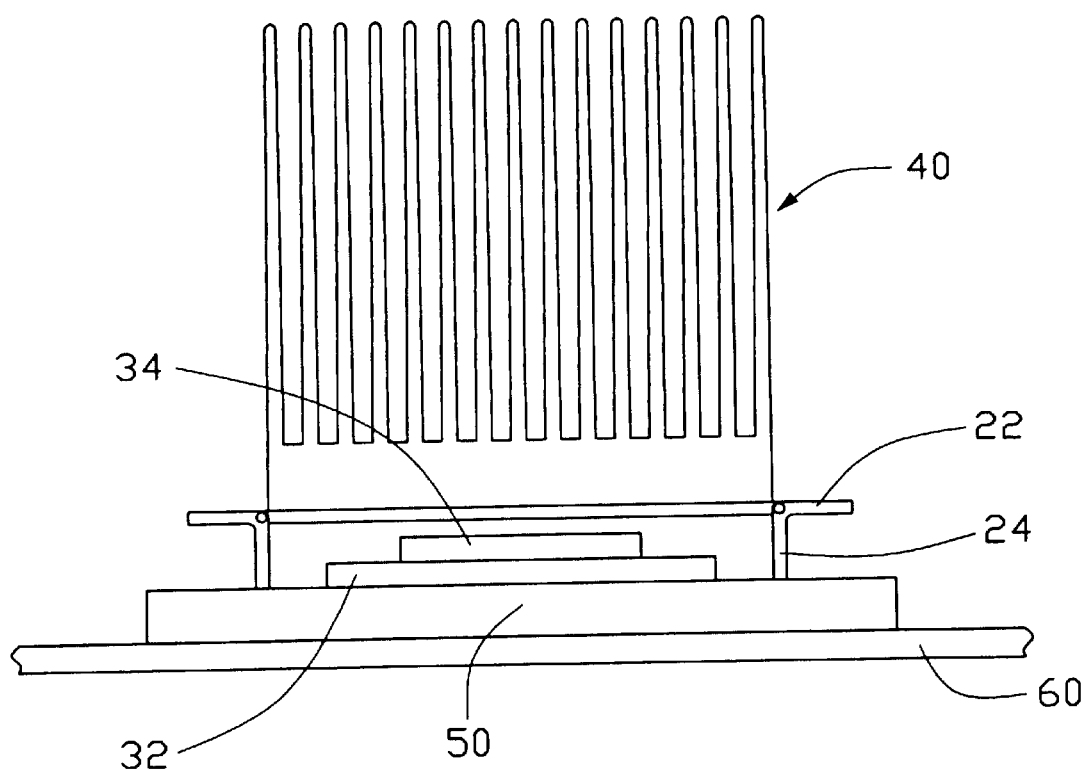
FIG. 3 is similar to FIG. 2, but showing the operating device detaching the heat sink from the CPU.

Referring to FIGS. 1–3, in order to detach the heat sink 40, the pressing portions 24 of two handles 14 at one side of the heat sink 40 are rotatingly pressed toward the base 32 of the CPU 30 until free ends of said pressing portions 24 contact a top of the socket 50. The operating portions 22 of the two handles 14 rotate away from the heat sink 40, and said side of the heat sink 40 is thereby elevated by the bracket 12. The above-described procedure is repeated in relation to an opposite side of the heat sink 40, such that the heat sink 40 is uniformly elevated by the bracket 12 (see FIG. 3). The heat sink 40 is thus easily and safely detached from the CPU 30.

During detachment of the heat sink 40 from the CPU 30, the heat sink 40 exerts upward force on the combined CPU 30, socket 50 and PCB 60. The pressing portions 24 of the operating device 10 exert downward force on the combined CPU 30, socket 50 and PCB 60. The operating device 10 balances the opposing upward and downward forces exerted on the combined CPU 30, socket 50 and PCB 60. This protects the CPU 30 and the PCB 60 from being damaged during detachment of the heat sink 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed. For example, the socket may be replaced by a socket module which not only electrically connects the CPU to the printed circuit board but also provides means for fastening the heat sink against the CPU. Moreover, the bracket may be a part of the heat sink or the socket module in an integral form.

What is claimed is:

1. An operating device for detaching a heat sink from a heat-generating electronic device, the operating device comprising:
   a bracket adapted to generally interpose between the heat sink and the heat-generating electronic device, an opening being defined in the bracket for receiving part of the heat-generating electronic device; and
   a pair of handles rotatably connected to opposite sides of the bracket, and actuating the bracket to move for facilitating detachment of the heat sink.

2. The operating device as described in claim 1, wherein the bracket comprises a pair of first beams, and a pair of second beams connecting the first beams.

3. The operating device as described in claim 2, wherein the first beams are substantially parallel to each other and substantially perpendicular to the second beams, thereby defining the opening.

4. The operating device as described in claim 2, wherein a pair of pivots is arranged at an end of each of the first beams.

5. The operating device as described in claim 4, wherein the handles each have a generally L-shaped profile.

6. The operating device as described in claim 5, wherein each of the handles comprises an operating portion and a pressing portion substantially perpendicular to each other, a pair of holes is defined at junctions of the operating portion and the pressing portion, and the holes movably receive the pivots of a corresponding first beam.

7. An operating device for detaching a heat sink from an electronic device, comprising:
   a bracket comprising a pair of first beams and a pair of second beams connecting the first beams, an opening being defined in the bracket for receiving a heat-generating electronic device, a pivot extending from each of opposite ends of the first beams; and
   a plurality of handles pivotably connected to the bracket, each of the handles comprising an operating portion and a pressing portion, a hole being defined at a junction of the operating portion and the pressing portion pivotably receiving a corresponding pivot of the bracket, wherein the handles cause the bracket to move when operated.

8. The operating device as described in claim 7, wherein the first beams are substantially parallel to and spaced from each other.

9. The operating device as described in claim 8, wherein the second beams are spaced from each other and substantially perpendicular to the first beams.

10. The operating device as described in claim 7, wherein the handles each have a generally L-shaped profile.

11. An electronic device assembly, comprising:
    an electronic device;
    a printed circuit board;
    a socket connecting the electronic device to the printed circuit board;
    a heat sink mounted on the electronic device for dissipating heat therefrom; and
    an operating device for detaching the heat sink from the electronic device, comprising:
       a bracket disposed generally between the heat sink and the electronic device, the bracket comprising two first beams and two second beams placed on the electronic device, a pivot being arranged at each of opposite ends of the first beams; and
       a plurality of handles movably connected with the bracket, each of the handles comprising an operating portion and a pressing portion, a pivot hole being defined at a junction of the operating portion and the pressing portion, the pivot hole movably receiving a corresponding pivot of the bracket.

12. The electronic device assembly as described in claim 11, wherein the electronic device comprises a base and a protrusion at a center of the base.

13. The electronic device assembly as described in claim 11, wherein the second beams substantially perpendicularly connect the first beams.

14. The electronic device assembly as described in claim 11, wherein an opening is defined in the bracket receiving the protrusion.

15. The electronic device assembly as described in claim 11, wherein the pressing portion is substantially perpendicular to the operating portion.

16. An electronic device assembly comprising:
    a printed circuit board;
    a socket secured on the printed circuit board;
    an electronic device comprising a base and a protrusion;
    a heat sink attached on the protrusion;
    a bracket disposed generally between the heat sink and the electronic device, and defining an opening receiving the protrusion therein; and
    a plurality of handles pivotably engaged with the bracket, wherein the handles can be pivoted to cause the bracket to impel the heat sink away from the socket for facilitating detachment of the heat sink from the electronic device.

17. An electrical assembly comprising:
    a printed circuit board;

a socket module mounted on the printed circuit board and connecting an electronic device to the printed circuit board;

a heat sink positioned upon the electronic device; and at least one operating device equipped with one of said socket module and said heat sink; wherein said operating device is configured not only not to hinder abutment between the heat sink and the electronic device when said heat sink is pressed against the electronic device and spaced from the socket module in a minimum distance, but also to be moveable to increase the said minimum distance and urge the heat sink away from the socket module when said heat sink is intended to be detached from said electronic device.

18. The assembly as described in claim 17, wherein said operating device includes a bracket and at least one moveable operating handle thereof.

19. The assembly as described in claim 18, wherein said bracket is discrete from either the socket module or the heat sink.

20. The assembly as described in claim 18, wherein said operating handle is rotatably moved.

21. An electronic assembly comprising:

a socket module;

an electronic device on the socket module;

an operating device placed on the electronic device; and a heat sink attachable to the electronic device, wherein the operating device defining an opening to allow a thermal contact between the heat sink and the electronic device, and when the heat sink is to be detached from the electronic device, the operating device exert forces on the heat sink and the socket respectively in opposite directions.

* * * * *